United States Patent
Coumou et al.

(10) Patent No.: US 12,142,461 B2
(45) Date of Patent: Nov. 12, 2024

(54) CONTROL AND PREDICTION OF MULTIPLE PLASMA COUPLING SURFACES AND CORRESPONDING POWER TRANSFER

(71) Applicant: Applied Materials, Inc., Santa Clara, CA (US)

(72) Inventors: David Coumou, Webster, NY (US); Zhi Wang, Sunnyvale, CA (US); Tao Zhang, San Ramon, CA (US); David Peterson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 259 days.

(21) Appl. No.: 17/737,670

(22) Filed: May 5, 2022

(65) Prior Publication Data

US 2023/0360886 A1    Nov. 9, 2023

(51) Int. Cl.
*H01J 37/32* (2006.01)

(52) U.S. Cl.
CPC .. *H01J 37/32183* (2013.01); *H01J 37/32935* (2013.01); *H01J 2237/332* (2013.01)

(58) Field of Classification Search
CPC ........... H01J 37/32183; H01J 37/32935; H01J 2237/332; H01J 37/32926; H01J 37/3299
See application file for complete search history.

(56) References Cited

U.S. PATENT DOCUMENTS

| | | | |
|---|---|---|---|
| 2006/0012308 A1* | 1/2006 | Llic | H05H 1/46 315/111.21 |
| 2007/0091541 A1* | 4/2007 | Buchberger | H01J 37/32724 361/234 |
| 2011/0065279 A1* | 3/2011 | Buchberger, Jr. | H01L 21/67069 438/715 |
| 2017/0103870 A1 | 4/2017 | Marakhtanov et al. | |
| 2021/0134570 A1* | 5/2021 | Yamazaki | H01J 37/32926 |
| 2021/0296083 A1* | 9/2021 | Kaneko | H01J 37/32568 |

FOREIGN PATENT DOCUMENTS

| | | |
|---|---|---|
| JP | 2016170940 A | 9/2016 |
| KR | 1020200097161 A | 8/2020 |

OTHER PUBLICATIONS

International Search Report and Written Opinion from PCT/US2023/018033 dated Jul. 31, 2023, 9 pgs.

* cited by examiner

*Primary Examiner* — Abdullah A Riyami
*Assistant Examiner* — Syed M Kaiser
(74) *Attorney, Agent, or Firm* — Schwabe, Williamson & Wyatt, P.C.

(57) ABSTRACT

Embodiments disclosed herein include a process power controller for a plasma processing tool. In an embodiment, the process power controller includes a process power source optimizer, a source predictor, and a process uniformity controller. In an embodiment, the source predictor is communicatively coupled to the process power source optimizer and the process uniformity controller.

17 Claims, 10 Drawing Sheets

270 ↘

271 ↘
| MAKING A FIRST PARAMETER CHANGE IN A FIRST CONTROL LOOP |

272 ↘
| FEEDING FORWARD THE FIRST PARAMETER CHANGE TO A SECOND CONTROL LOOP |

273 ↘
| MAKING A SECOND PARAMETER CHANGE IN THE SECOND CONTROL LOOP TO ANTICIPATE A SYSTEM CHANGE GENERATED BY THE FIRST PARAMETER CHANGE |

381 ↘
| CHANGING A CAPACITANCE OF A THIRD VARIABLE CAPACITOR IN A CIRCUIT |

382 ↘
| FEEDING FORWARD THE CHANGE OF CAPACITANCE OF THE THIRD CAPACITOR TO A MATCH CONTROLLER |

383 ↘
| USING THE MATCH CONTROLLER TO CHANGE CAPACITANCES OF ONE OR BOTH OF A FIRST VARIABLE CAPACITOR AND A SECOND VARIABLE CAPACITOR IN THE CIRCUIT IN RESPONSE TO THE CHANGE OF CAPACITANCE OF THE THIRD VARIABLE CAPACITOR |

FIG. 3

CONTROL AND PREDICTION OF
MULTIPLE PLASMA COUPLING SURFACES
AND CORRESPONDING POWER TRANSFER

BACKGROUND

1) Field

Embodiments relate to the field of semiconductor manufacturing and, in particular, to an adaptive control architecture in order to improve impedance matching.

2) Description of Related Art

In plasma processing tools, the plasma is ignited by a cathode that is coupled to processing gasses within a chamber. In most tools, a power supply is coupled to the cathode through an impedance matching network (sometimes referred to simply as a "match"). The match allows for the impedance of the system to be adjusted in order to vary the impedance of the load to which the cathode is coupled. The impedance matching network load has a wide range of impedances that are dictated by parameters such as processing conditions, chamber architecture, and the like. Matching the impedances is important to provide efficient power transfer from the power supply to the load by adjusting the impedance matching network impedance for equivalence with the transmission line impedance.

In some plasma systems, a plurality of antennas are used in order to control the plasma density at different locations within the plasma chamber. For example, an inner antenna and an outer antenna may control the plasma density at the center of a wafer and at the edge of the wafer, respectively. The changes in plasma density alters the impedance of the system. As such, the match needs to be adjusted to match the new load impedance of the system. That is, the impedance changes, and the match is changed after the impedance changes. Such a configuration makes it difficult to quickly and accurately match impedance changes in the system since the impedance control follows the change in the system.

SUMMARY

Embodiments disclosed herein include a process power controller for a plasma processing tool. In an embodiment, the process power controller includes a process power source optimizer, a source predictor, and a process uniformity controller. In an embodiment, the source predictor is communicatively coupled to the process power source optimizer and the process uniformity controller.

Embodiments may also include a method of controlling a plasma system. In an embodiment, the method comprises making a first parameter change in a first control loop, feeding forward the first parameter change to a second control loop, and making a second parameter change in the second control loop to anticipate a change to the plasma system generated by the first parameter change.

Embodiments may also include a method of controlling a plasma system. In an embodiment, the method comprises changing a first variable reactance actuator, feeding forward the change of the first variable reactance actuator to a match controller, and using the match controller to change actuation setting of one or both of a second variable reactance actuator and a third variable reactance actuator in response to the change of the first variable reactance actuator.

BRIEF DESCRIPTION OF THE DRAWINGS

FIG. 2 is a process flow diagram of a process for feeding forward information from a first control loop to a second control loop, in accordance with an embodiment.

FIG. 3 is a process flow diagram of a process for feeding forward changes to a third variable capacitor to a controller for controlling the impedance in a plasma system, in accordance with an embodiment.

DETAILED DESCRIPTION

Figure 1:
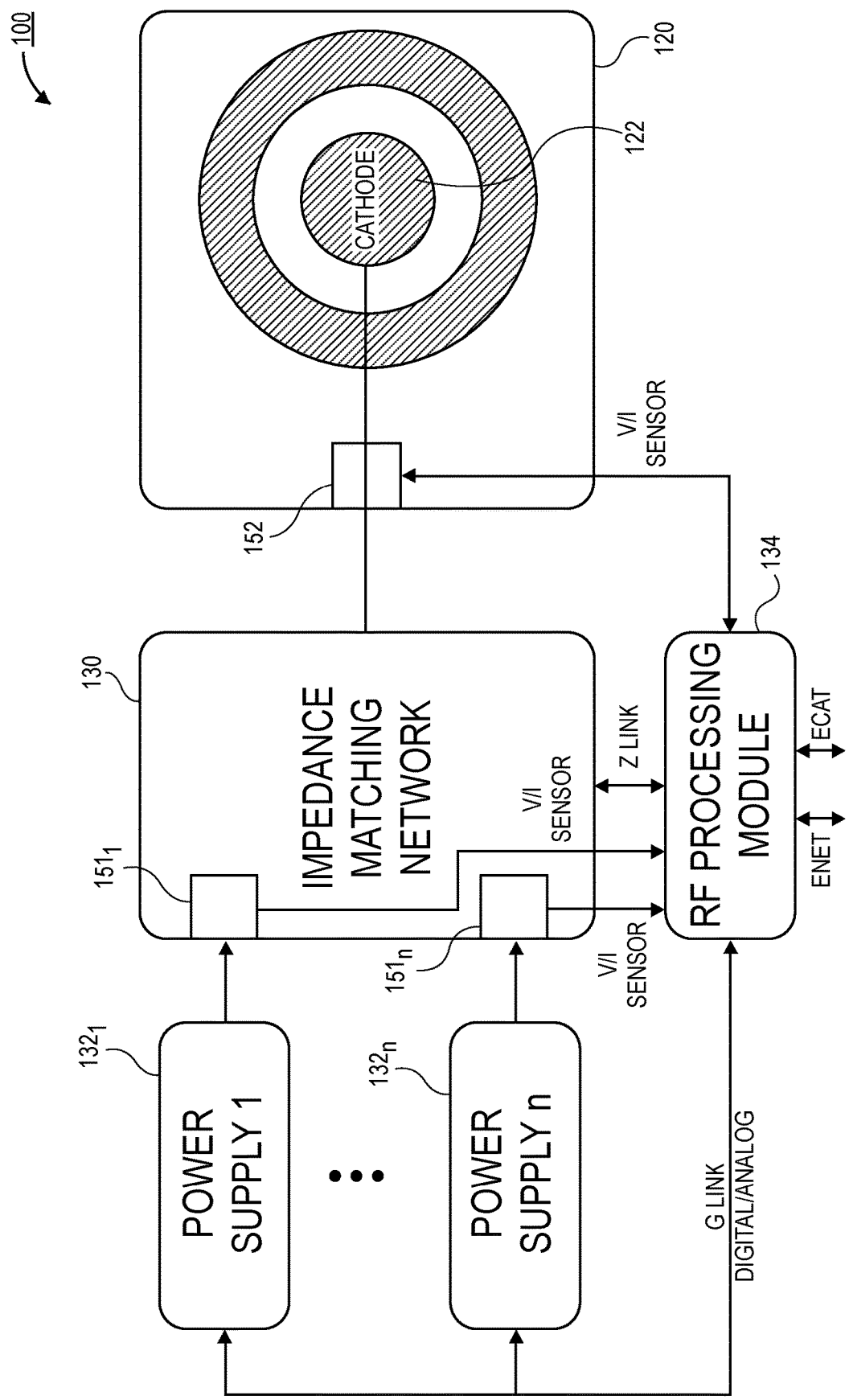
FIG. 1 is a schematic of a plasma processing tool that includes a centralized control architecture, in accordance with an embodiment.

Systems described herein include an adaptive control architecture with supported model in order to improve process power control and associated plasma control at a plural set of power coupling surface that influence plasma densities and sheath. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, control of plasma parameters of a plasma system are not cohesive. Changes to one aspect of the plasma in the system may alter other aspects of the plasma. For example, plasma density changes may result in impedance changes of the load. Since the impedance changes, the configuration of the match must then be altered to match the new impedance. However, embodiments disclosed herein include a feedforward control system between control loops in order to provide centralized and cohesive control of the plasma processing system.

Power coupled to a plasma source occurs (1) through multiple injection sites; and (2) utility of multiple, and sometimes distributed, antennas. Through the electromagnetic interaction in these mechanisms, power coupling from one site or antenna can influence power transfer at a second site or antenna. Accordingly, embodiments disclosed herein use control of the power coupling to predict power coupling changes to minimize disturbances and instabilities that can influence device performance and yield.

In an embodiment, centralized control enables a predictive and adaptive control between plasma power coupling and power transfer. The generalized scheme is demonstrated with controlling plasma power coupling through a first process power plasma coupling point (e.g., inner) and a second process power plasma coupling point (e.g., outer) configuration with disturbance minimization by impedance tuning predictions (power transfer) with influence of absorbed power dynamics.

Generally, embodiments described herein include two control loops that are coupled together by a feedforward link. A first control loop alters the process power that flows through a pair of injection sites (one for an inner plasma and another for an outer plasma). As the first control loop changes the local plasma parameter, say densities, the impedance of the system is changed. In order to allow for optimal power transfer (i.e., minimized reflected power), the change to the first control loop is fed forward to a second control loop that controls a second aspect of power coupling, say the impedance matching. As such, the second control loop can adjust (in anticipation of the change in impedance) in order to maximize the power delivery.

More particularly, the first control loop includes a third variable capacitor, and the second control loop includes a first variable capacitor and a second variable capacitor. Changes to the third variable capacitor are made to alter plasma densities within the plasma system. In an embodiment, the changes to the third variable capacitor are fed forward to the second control loop in order to make changes to the first variable capacitor and/or the second variable capacitor in order to anticipate changes to the impedance.

Generally, the plasma processing tool includes one or more power supplies. The power supplies are coupled to the cathode (or antenna) in the chamber through an impedance matching network. Process power sensors (e.g., voltage and current sensors (V/I sensors)) are provided upstream and downstream of the impedance matching network. The sensors aid in the control of power delivery to the cathode.

In an embodiment, the first control loop and the second control loop may be implemented in the impedance matching network. The impedance matching network may include circuitry that includes at least a first variable capacitor, a second variable capacitor, and a third variable capacitor. The first and second variable capacitors may be part of a second control loop, and the third variable capacitor may be part of a first control loop.

Referring now to FIG. 1, a more detailed schematic of a plasma processing tool 100 is shown, in accordance with an embodiment. In an embodiment, the plasma processing tool 100 includes a plasma chamber 120. The plasma chamber 120 includes a cathode 122 in order to couple the power received to one or more gasses flown into the plasma chamber 120. In an embodiment, the plasma chamber 120 may be suitable for any plasma process typical of semiconductor manufacturing environments. For example, the plasma chamber 120 may be a plasma etching chamber, a plasma deposition chamber, a plasma treatment chamber, or the like. In a particular embodiment, the plasma chamber 120 may be a plasma enhanced chemical vapor deposition (PECVD) chamber, a physical vapor deposition (PVD) chamber, or a plasma enhanced atomic layer deposition (PEALD) chamber.

In an embodiment, the plasma chamber 120 may be coupled to a power delivery architecture. For example, the power delivery architecture may include one or more power supplies $132_1$-$132_n$. In the illustrated embodiment, a plurality of power supplies 132 are shown. However, it is to be appreciated that a single power supply 132 may be used in some embodiments. In an embodiment, the power supplies 132 may include any type of power supply. For example, the power supplies 132 may be RF power supplies, microwave power supplies, direct current (DC) power supplies, pulsed DC power supplies, or the like, or any combination of these power supply types.

In an embodiment, the power supplies 132 may be coupled to the cathode 122 through a process power optimizer actuator 130. The process power optimizer actuator 130 may sometimes be referred to as an impedance matching network. The process power optimizer actuator 130 alters the impedance of the power delivery architecture in order to match the load in the chamber 120. Due to changes in processing conditions (e.g. gas flow rates, pressure, temperature, etc.) the impedance of the load can vary. As such, the process power optimizer actuator 130 is used to match the changing impedance in order to provide efficient and optimal power delivery into the chamber (i.e., with no or minimal reflected power). In an embodiment, the circuitry for matching the impedance may include a first variable reactance actuator and a second variable reactance actuator. For example, the variable reactance actuators may be variable capacitors in some embodiments.

The process power optimizer actuator 130 may also include circuitry for controlling plasma density within the plasma chamber 120. For example, a third variable reactance actuator may control process power through a first of two outputs The power from each output couples to the plasma and determines the plasma densities. In an embodiment, the circuitry with the first variable reactance actuator, the second variable reactance actuator, and the third variable reactance actuator may be connected together as part of a larger circuit. However, the third variable reactance actuator may be on a different control loop from the first variable reactance actuator and the second variable reactance actuator.

In an embodiment, sensors 151 and 152 may be provided on opposite ends of the impedance matching network 130. For example, sensors $151_1$-$151_n$ may be on an upstream side of the impedance matching network 130, and sensor 152 may be on a downstream side of the impedance matching network 130. The "upstream" side may refer to the input side of the matching network 130, and the "downstream" side may refer to the output side of the matching network 130. As shown, a plurality of sensors $151_1$-$151_n$ are provided on the upstream side of the impedance matching network 130. The number of sensors 151 may be equal to the number of power supplies 132. That is, each power supply 132 may have a dedicated sensor 151. The downstream side of the impedance matching network 130 may have a single sensor 152. However, it is to be appreciated that when there is more than one output from the matching network 130, there may be additional sensors 152. For example, in a case where there is two outputs (e.g., for a center of the chamber 120 and an edge of the chamber 120), there may be two sensors 152.

In the case of multiple sensors 151, the plurality of sensors $151_{1-n}$ may be fabricated on a single PCB. That is, a single module may include multiple sensors. Generally, embodiments described herein include electrical shielding techniques that limit the cross coupling between sensors on a single PCB.

In FIG. 1, the sensors 151 and 152 are shown generally as blocks. However, it is to be appreciated that the sensors 151 and 152 may be similar to any suitable sensor architecture. For example, each sensor 151 and/or 152 may be a voltage and current (i.e., V/I) sensor. The voltage may be detected by an embedded voltage ring, and the current may be detected by a current loop. The sensors may have an aperture through which a cable (e.g., an RF cable) passes.

In an embodiment, the sensors 151 and 152 may be communicatively coupled with a processing module 134. As shown, a process power control module 134 is provided in FIG. 1. However, it is to be appreciated that the processing module may be a microwave processing module 134, a DC processing module, and RF processing module, or the like, depending on what type of power supplies 132 are included in the tool 100. In an embodiment, the sensors 151 and 152 deliver the voltage and/or current to the process power control module 134. The process power control module 134 may also provide control of the first control loop and the second control loop used to alter impedance in the impedance matching network 130 and/or plasma density within the chamber 120. In an embodiment, the processing module 134 may have external connections for different physical layers and protocols, such as an Ethernet (ENET) and an standardized industrial connection, like EtherCAT.

In an embodiment, the processing module 134 may be coupled to the impedance matching network. The processing module 134 may be able to send control signals to the impedance matching network 130. For example, control signals may be used to adjust variable reactance actuators within the impedance matching network 130. Additionally, the processing module 134 may be coupled to the power supplies 132. As such, the processing module 134 is capable of coordinated impedance tuning for optimal power transfer.

It is to be appreciated that changes to the first control loop will result in changes to the impedance. As such, a change in the first control loop will necessitate a change in the second control loop. In conventional systems, the first control loop is changed, and the second control loop will have a change later in time in order to account for the new impedance. That is, the control of the impedance is lagging behind changes in the system. As such, the dynamic control response of the impedance matching is suboptimal.

Accordingly, embodiments disclosed herein include a feedforward architecture between the first control loop and the second control loop. Changes to the first control loop are fed forward to the second control loop. In this way, the second control loop can make changes in anticipation of changes to the impedance of the system. Therefore, the second control loop is no longer lagging behind the first control loop, and power delivery performance is improved.

Referring now to FIG. 2, a process flow diagram of a process 270 for controlling a semiconductor processing tool is shown, in accordance with an embodiment. In an embodiment, the process 270 may be used in order to link together two or more control loops in order to provide improved control of the system. For example, the process 270 may be used to improve power delivery efficiency to a plasma processing tool, such as the tool described in greater detail above.

In an embodiment, process 270 may begin with operation 271, which comprises making a first parameter change in a first control loop. In an embodiment, the first parameter change may be a change to any parameter within a plasma processing tool. For example, the first parameter change may be a change in the plasma density of one or more regions within a plasma processing tool. In a particular embodiment, the first parameter change may be the change of a variable reactance actuator in an impedance matching network. The variable capacitor may control current flow through two or more inductors that dictate the plasma density within one or more regions of the plasma chamber.

In an embodiment, process 270 may continue with operation 272, which comprises feeding forward the first parameter change to a second control loop. In an embodiment, the feedforward operation may occur before the first parameter change occurs. In other embodiments, the feedforward operation may occur substantially at the same time as the occurrence of the first parameter change. In an embodiment, the second control loop may include a pair of variable capacitors. The second control loop may be responsible for setting an impedance of an impedance matching network. Particularly, the first parameter change may result in a change in the impedance of the load. As such, the pair of variable capacitors may need to have their capacitances changed in order to match the new impedance of the system. Since the feedforward signal is delivered to the second control loop before, or at the same time of the first parameter change, the second control loop can anticipate changes to the impedance of the system and provides an improved control of the system.

In an embodiment, process 270 may continue with operation 273, which comprises making a second parameter change in the second control loop to anticipate a system change generated by the first parameter change. Particularly, the second parameter change may be the mechanical change to one or more variable capacitors in order to change the impedance of the impedance matching network. As noted above, the system change may be a change in the impedance of the system. Accordingly, rapid change to the second control loop may be used in order to improve control of the system.

Referring now to FIG. 3, a process flow diagram of a process 380 for controlling an impedance matching network in a plasma tool is shown, in accordance with an embodiment. In an embodiment, the process 380 may include a first control loop and a second control loop. The first control loop may be used to change the amount of current flowing through a pair of inductors in an impedance matching network, and the second control loop may be used to change the impedance of the impedance matching network.

In an embodiment, the process 380 may begin with operation 381, which comprises changing a capacitance of a third variable capacitor in a circuit. In an embodiment, the third variable capacitor may be a capacitor that controls the flow of current through a pair of inductors. For example, a first inductor may be responsible for generating a plasma in a center of a chamber and a second inductor may be responsible for generating a plasma at an edge of the chamber. The change in the capacitance of the third capacitor, therefore, can be used to change the plasma density within the chamber at the center and the edge of the chamber.

In an embodiment, the process 380 may continue with operation 382, which comprises feeding forward the change of capacitance of the third capacitor to a match controller. In an embodiment, the match controller may be responsible for adjusting the capacitances of variable capacitors within the impedance matching network. For example, the match controller may be responsible for controlling the third capacitor, a first capacitor, and a second capacitor. The first capacitor and the second capacitor may be used to change an impedance of the matching network.

In an embodiment, the feedforward operation may occur as the change to the third capacitor is implemented. In other embodiments, the feedforward operation may occur before the change to the third capacitor is implemented. As such, changes to the impedance of the match network may anticipate the changes to the impedance in the system. Accordingly, control of the impedance matching is improved.

In an embodiment, the process 380 may continue with operation 383, which comprises using the match controller to change capacitances of one or both of the first variable capacitor and the second variable capacitor in the circuit in response or anticipation to the change of capacitance of the third variable capacitor 383. In an embodiment, the match controller may send control signals to the impedance matching network in order to change the capacitances of the first variable capacitor and the second variable capacitor. The control signal may be sent to one or more motor controllers that physically changes the variable capacitors. In other embodiments, the first variable capacitor and the second variable capacitor are solid state capacitors and the control signal may not necessarily change the physical structure of the first and second variable capacitors.

Figure 4:
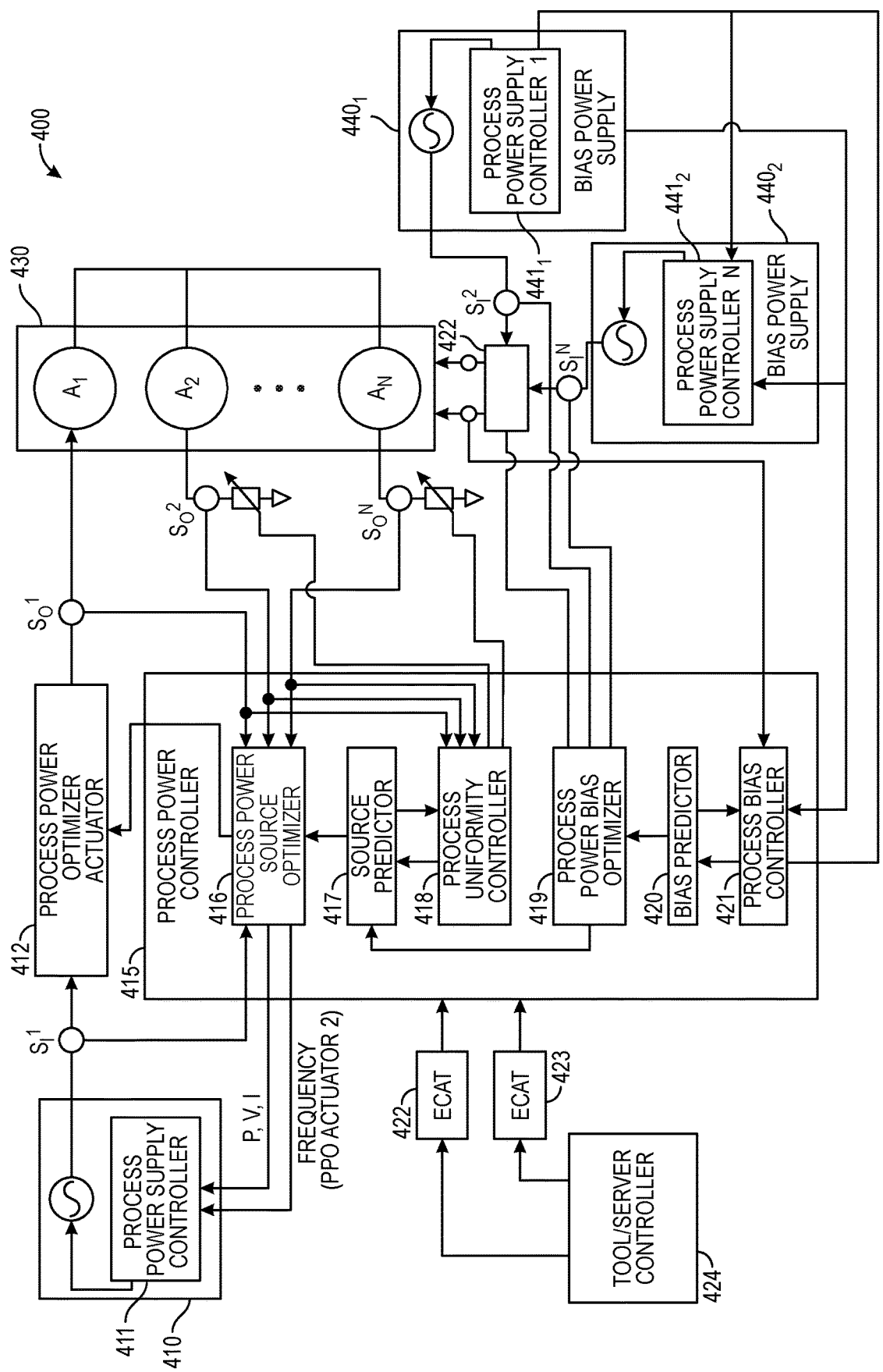
FIG. 4 is a schematic illustration of a control architecture for a plasma processing tool, in accordance with an embodiment.

Referring now to FIG. 4, a schematic illustration of a control architecture 400 for a plasma processing tool is shown in accordance with an embodiment. As shown, the control architecture 400 may include a source power supply 410. While a single source power supply is shown, it is to be appreciated that additional source power supplies 410 may be included in other embodiments. Additionally, the control architecture 400 may include one or more bias power supplies $440_1$-$440_N$. While a pair of bias power supplies 440 are shown in FIG. 4, it is to be appreciated that any number of bias power supplies 440 (i.e., one or more) may be used in accordance with an embodiment. In an embodiment, the source power supply 410 may include a process power supply controller 411. Similarly, the bias power supplies 440 may include process power supply controllers $441_1$-$441_N$.

In an embodiment, the source power supply 410 may be electrically coupled to an array 430 of one or more bias/cathode devices $A_1$-$A_N$ in the plasma processing tool. In an embodiment, a process power optimizer actuator 412 may be coupled between the source power supply 410 and the array 430. The actuator 412 may include actuation of a first capacitor and a second capacitor used to enable impedance matching. In an embodiment, an input sensor $S_i^1$ may be provided before the process power optimizer actuator 412, and an output sensor $S_o^1$ may be provided after the process power optimizer actuator 412. The bias power supplies 440 may supply power to the array 430 through a bias power optimizer actuator 442.

In an embodiment, a process power controller 415 may be communicatively coupled to the source power supply 410, the process power optimizer actuator, and the bias power supplies 440. The process power controller may include a process power source optimizer 416. The process power source optimizer 416 may be coupled to the process power supply controller 411. The process power source optimizer 416 may provide power, voltage, and current data to the process power supply controller 411. Additionally, a frequency actuation signal may be provided from the process power source optimizer 416 to the process power supply controller 411. A control signal may also be delivered from the process power source optimizer 416 to the process power optimizer actuator 412 in order to adjust the impedance. In an embodiment, the process power source optimizer 416 receives sensor data from sensors $S_i^1$, $S_o^1$, $S_o^2$, and $S_o^n$ in order to inform the control signals supplied to the process power supply controller 411 and the process power optimizer actuator 412. That is, the process power source optimizer may be referred to as the impedance tuning algorithm.

In an embodiment, the process power controller 415 may further comprise a source predictor 417. The source predictor 417 may be used to predict control actuations in order to anticipate changes to the load in the array 430. The source predictor 417 may be communicatively coupled to a process uniformity controller 418. The source predictor 417 may also receive a feedforward signal from the process power bias optimizer 419. That is, changes to control loop for the bias power supply 440 may be fed forward to the control loop for the source power supply 410. In an embodiment, the process uniformity controller 418 may also receive the inputs from the sensors $S_i^1$, $S_o^1$, $S_o^2$, and $S_o^n$. The process uniformity controller 418 may deliver actuation signals to variable inductors that control the current into the bias/cathode devices $A_1$-$A_N$.

In an embodiment, the process power controller 415 may further comprise a bias control loop. In an embodiment, the bias control loop may include a process power bias optimizer 419. The process power bias optimizer 419 may provide control signals to the bias power optimizer actuator 442 in order to control the impedance. The process power bias optimizer 419 may also receive feedback from a sensors $S_i^2$-$S_i^N$ in order to inform the control of the bias power optimizer actuator 442. As noted above, the process power bias optimizer 419 also provides a feedforward signal to the source predictor 417.

In an embodiment, the process power bias optimizer 419 also receives information from the bias predictor 420. The bias predictor 420 may be communicatively coupled with the process bias controller 421. The process bias controller 421 interfaces with the process power supply controllers 441.

In an embodiment, the control architecture 400 may further comprise external connectors such as an ENET link 422 and/or an ECAT link 423. The external connectors may be coupled to a tool/server controller 424 in order to provide tool processing information (e.g., temperatures, pressure, etc.) to the control architecture 400.

In an embodiment, the source predictor 417 (and the bias predictor 420) may comprise a means for calibrating the influence provided to the process power optimizer 416 (or the process power bias optimizer 419). Generally, the predictors 417 and 420 need to know how to influence the optimizers 416 and 419. In one embodiment, information for calibrating the predictors 417 and 420 may be obtained from the process uniformity controller 418 and the process bias controller 421, respectively. The information received by the predictors 417 and 420 may inform models of the system 400, and allow for the information delivered to the optimizers 416 and 419 to be in the correct format.

Figure 5A:
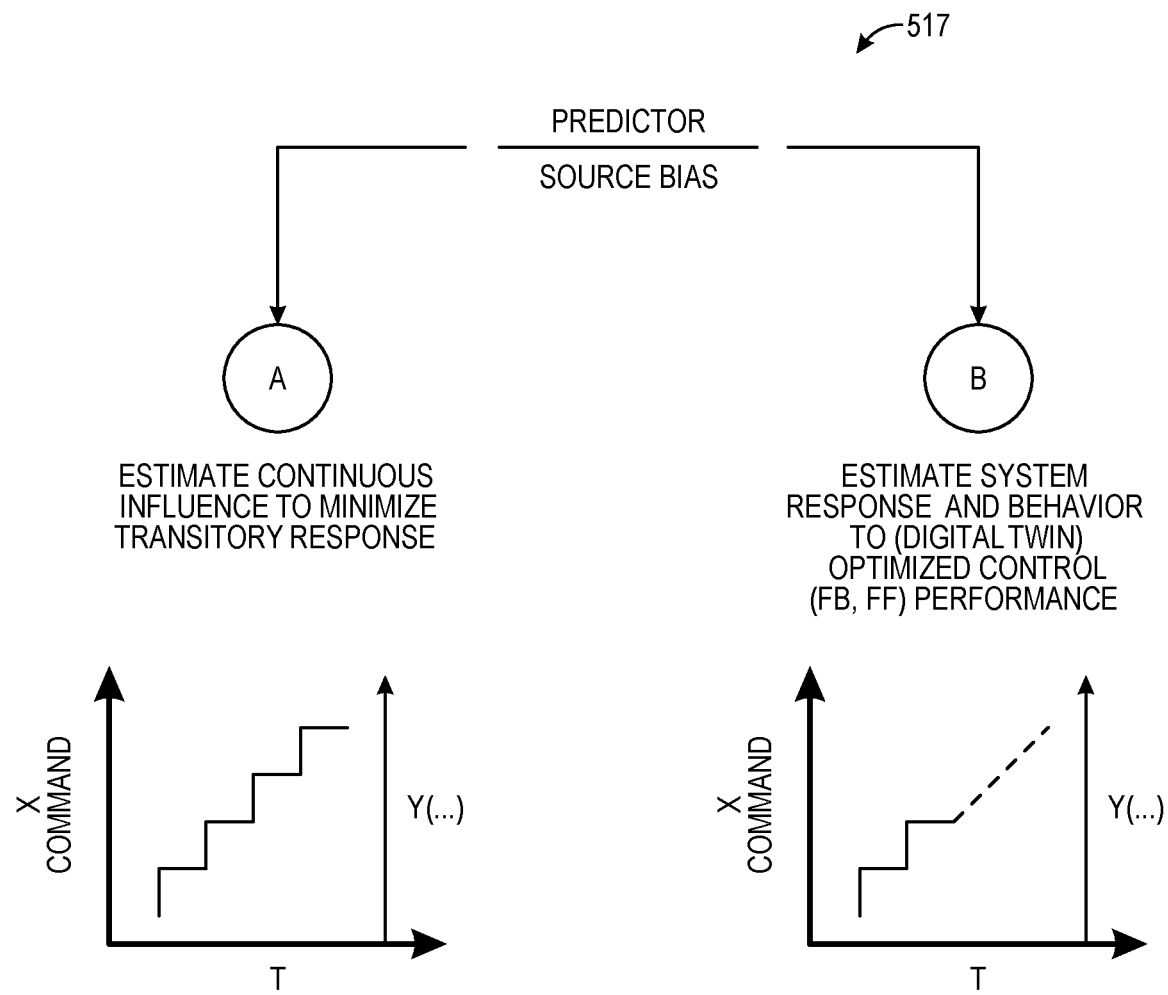
FIG. 5A is a schematic of a predictor in the control architecture of FIG. 4, in accordance with an embodiment.

Referring now to FIG. 5A, an illustration more clearly depicting the functionality of the predictor 517 is shown, in accordance with an embodiment. While referred to as predictor 517, it is to be appreciated that the predictor described in FIG. 5A may be used for one or both of the source power and the bias power. In an embodiment, the predictor includes two different control paths, which are labeled A and B.

In an embodiment, the control path A estimates continuous influence to minimize transistor response. As shown in the graph below path A, the X-command is a time iterative function and shows that continuous control provided over the course of time in order to continuously adjust to changing plant dynamics (perturbations and transients) parameters. In an embodiment, the control path B estimates system response and behavior to (a digital twin) and includes optimized control performance using feedforward (ff) and feedback (fb) signals from the control architecture. As shown in the graph below path B, the control of the X-command begins with an iterative function, and then continues with a dashed line to represent that the control anticipates an ending target condition and plots an efficient path to that control objective ending condition.

Figure 5B:
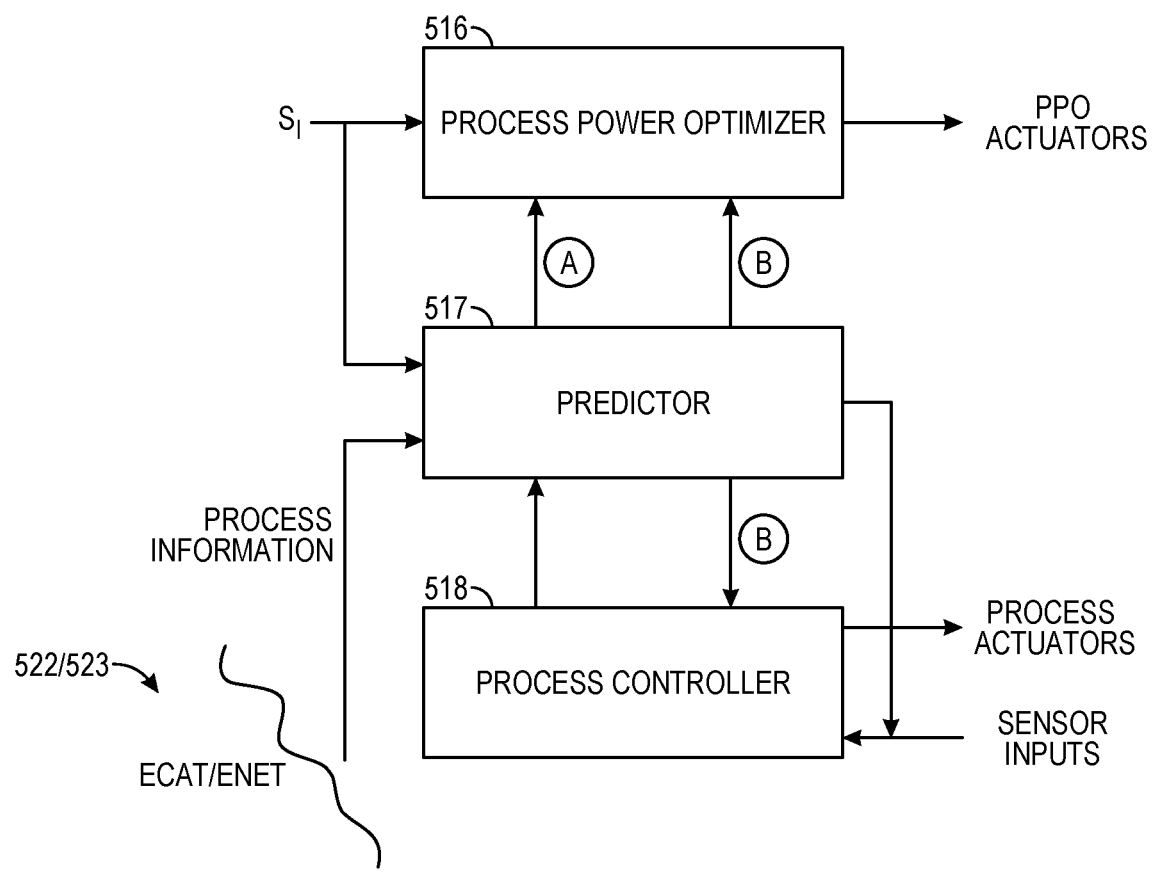
FIG. 5B is a flow diagram of showing data flowing to/from the predictor, in accordance with an embodiment.

Referring now to FIG. 5B, an illustration showing the data processing from the predictor 517 is shown, in accordance with an embodiment. In an embodiment, the predictor 517 may be the bias predictor or the source predictor described above. As shown, the predictor 517 may be communicatively coupled to a process power optimizer 516. Particularly, the predictor may have two different input options to the process power optimizer 516: an A path; or a B path. The A path and the B path may be similar to the embodiments described above in FIG. 5A. In an embodiment, the predictor 517 may also be provided with a connection to the process controller 518. For example, a B path may be provided between the predictor 517 and the process controller 518. The predictor 517 may also receive process information from the ECAT/ENET links 522 and 523.

Figure 6:
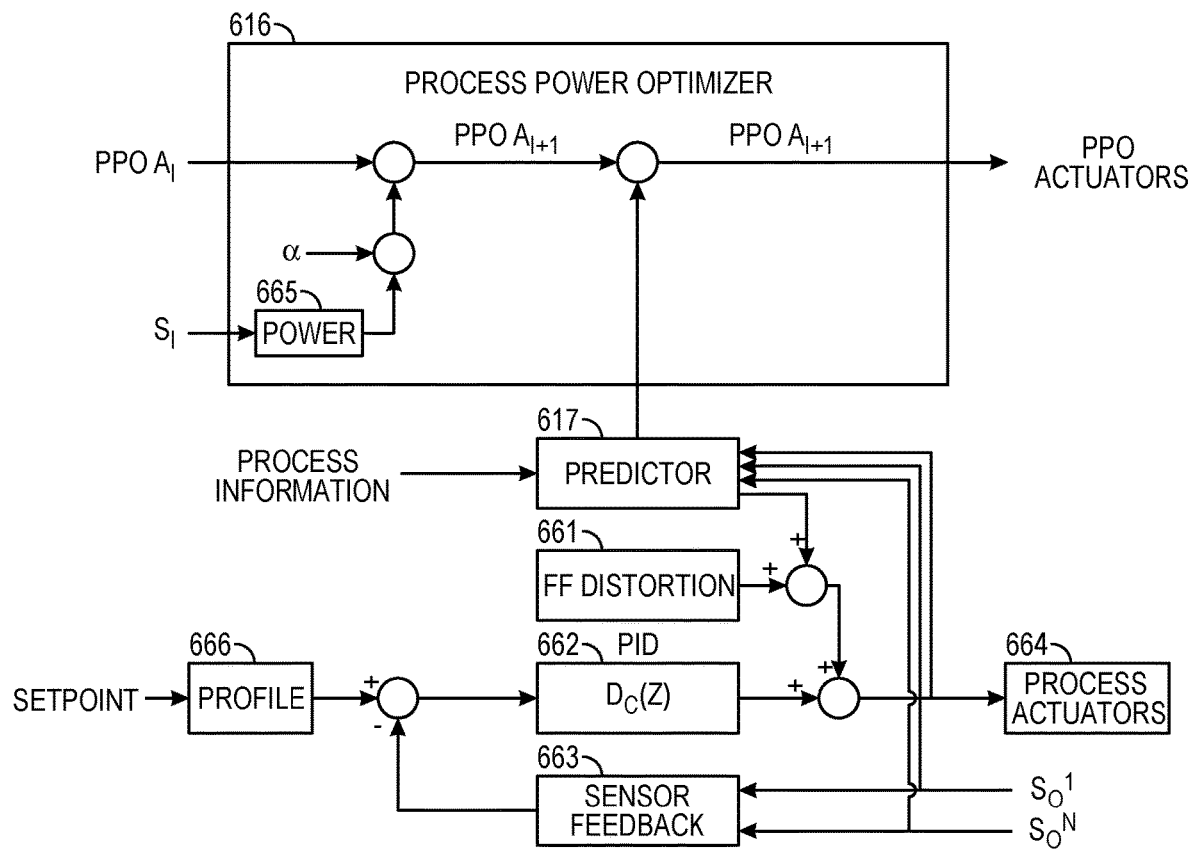
FIG. 6 is an illustration of a process control architecture for a plasma processing tool, in accordance with an embodiment.

Referring now to FIG. 6, a process control architecture 600 is shown, in accordance with an additional embodiment. In an embodiment, the architecture 600 may include a first loop and a second loop. The first control loop may be provided in the process power optimizer 616, and the second control loop may be provided below the process power optimizer. The two control loops may be coherently coupled together through the predictor 617. In an embodiment, the process power optimizer actuators (PPO $A_i$) feedforward and are coupled with a signal from the power 665. The power signal may be informed by sensors $S_i$. The combined signal is then added with a first branch extending from the top of the predictor 617. The first branch may be an A path, similar to embodiments described in greater detail above. After combining with the predictor signal, the first control loop proceeds to the PPO actuators in order to adjust the settings of the tool. The predictor 617 may be informed by sensors $S_o^1$-$S_o^N$ and a process actuation signal that is routed from the PID 662 to the process actuators 664.

In the second control loop, a setpoint is provided to a profile 666. The profile 666 may be a set of processing conditions (e.g., temperatures, pressures, gas flow rates, etc.) that are presently implemented (or soon to be implemented) in the tool. The profile 666 may then have a signal that is added to a sensor feedback signal from the sensor feedback block 663. The sensor feedback block 663 may be informed by the sensors $S_o^1$-$S_o^N$.

In an embodiment, the PID 662 may receive the signal from the profile 666. The output of the PID 662 may be combined with a signal from a feed feedforward (FF) distortion block 661. The signal from feedforward distortion block 661 may first be combined with a signal from the predictor 617. The combined signal (i.e., the predictor 617 signal and the FF distortion 661 signal) may then be propagated to the process actuators 664 in order to control the impedance and/or power delivery in the system.

Figure 7A:
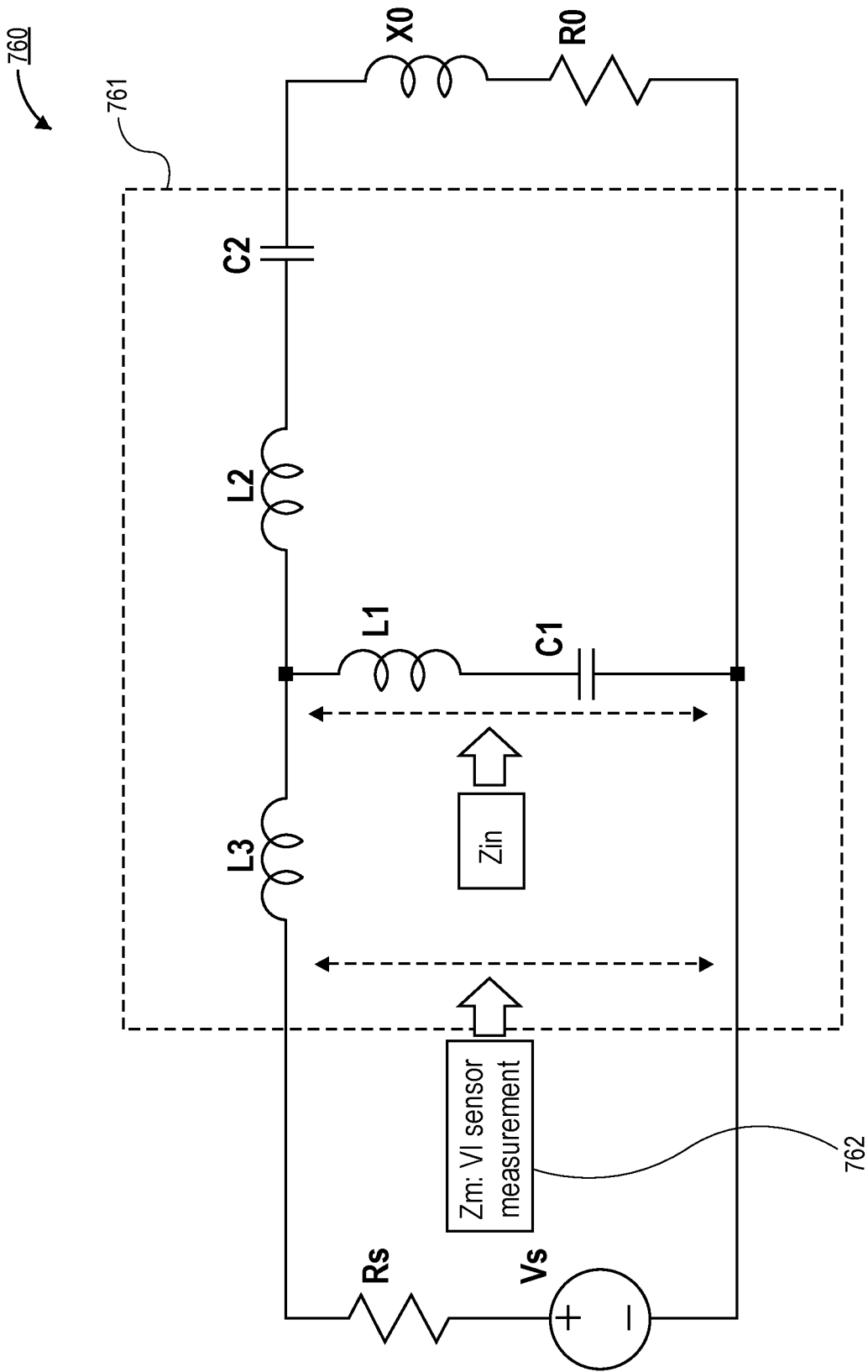
FIG. 7A is a schematic illustration of an RF match system, in accordance with an embodiment.
Figure 7B:
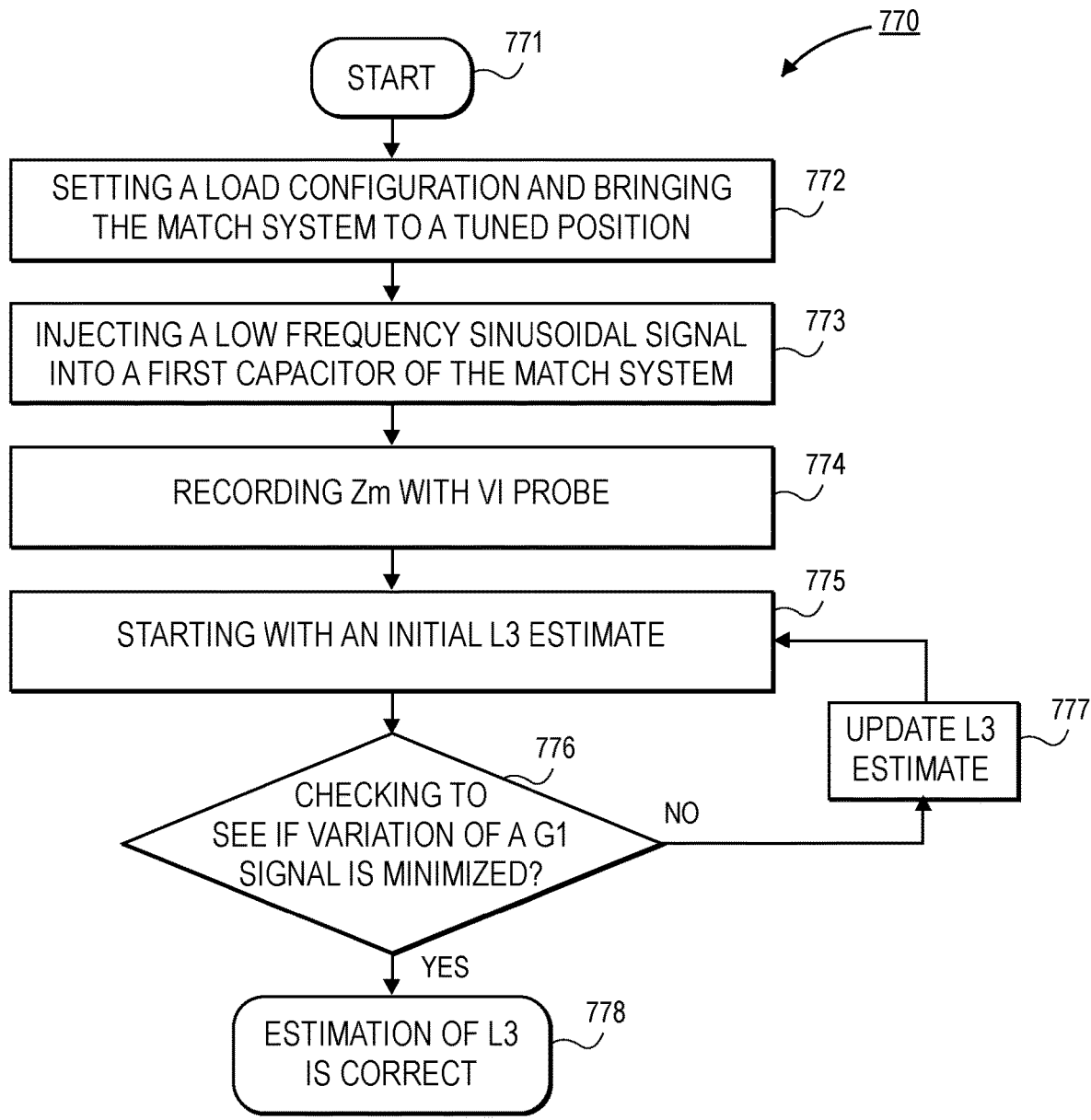
FIG. 7B is a process flow diagram of a process for finding a value of an inductor L3 of the match system, in accordance with an embodiment.
Figure 7C:
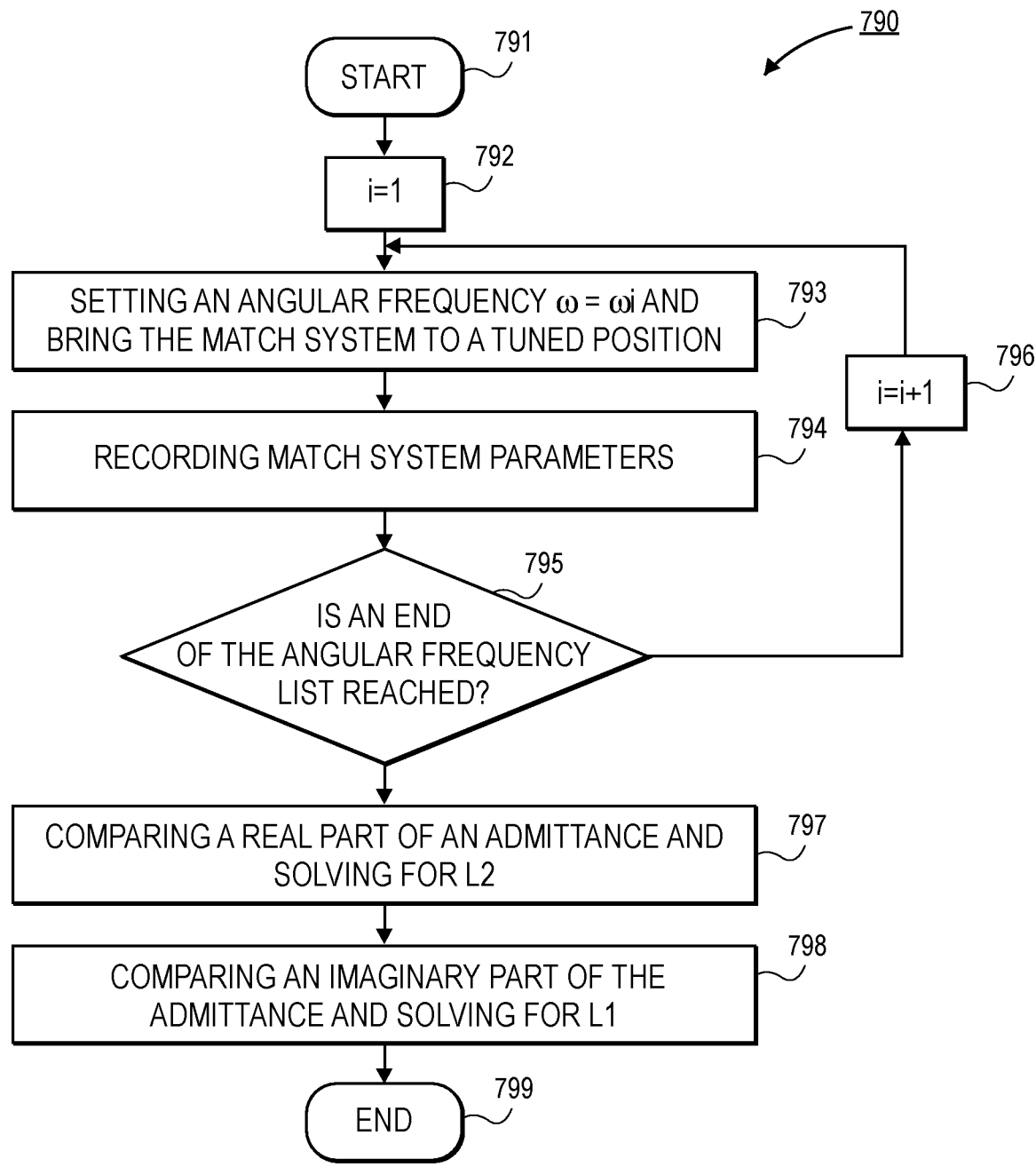
FIG. 7C is a process flow diagram of a process for finding a value of inductors L1 and L2 of the match system, in accordance with an embodiment.

Referring now to FIGS. 7A-7C, a process for executing a non-invasive approach to measure the circuit parameters within an RF match system is described. The ability to non-invasively measure the circuit parameters is useful in device manufacture. Additionally, over the course of use, the circuit parameters may drift. In order to properly calibrate the match system, it is desirable to learn which component or components have drifted, and the degree of the drift.

Referring now to FIG. 7A, a schematic illustration of a typical L-type network 760 for RF impedance matching is shown, in accordance with an embodiment. In an embodiment, the match system 761 is highlighted by a dashed box. The match system includes inductors L1, L2, and L3, along with capacitors C1 and C2. Capacitors C1 and C2 may be variable capacitors. A voltage and current (VI) sensor 762 is mounted at the input of the match system 761. The VI sensor 762 may provide the input impedance measurement Zm. The load impedance of the network is given by R0+jX0. Therefore, by changing the capacitance of the variable capacitors C1 and C2, the input impedance seen from the generator (Vs and Rs) toward the load (Zm) can be controlled. Ideally, in order to provide better control of the match system 761, the precise values of L1, L2, and L3 are known parameters.

Accordingly, embodiments include a process for determining L1, L2, and L3 with a non-invasive approach. The approach begins with a first process flow for finding the inductance of L3. The first process flow may include sending a sinusoidal signal into the first variable capacitor. The approach continues with a second process flow that dictates a process for calculating the values of L1 and L2 using the known inductance of L3.

Referring now to FIG. 7B, a process flow diagram depicting a process 770 for determining the inductance of L3 is shown, in accordance with an embodiment. As those in the art will appreciate, Yin is the admittance of Zin. Since Zin is in the form of Zm−jωL3, Yin will also have a real component (G1). G1 is not dependent on C1, and this property can be used in order to determine L3.

In an embodiment, process 770 may start 771 with operation 772, which includes setting a load configuration and bringing the match system to a tuned position. In an embodiment, the tuned position may be obtained using any suitable tuning mechanism, such as some of those described in greater detail herein. In an embodiment, the process 770 may continue with operation 773 which comprises injecting a low frequency sinusoidal signal into the first capacitor C1 of the match system. In an embodiment, the sinusoidal signal has a frequency between 1 Hz and 100 Hz. In other embodiments, the sinusoidal signal has a frequency between 1 Hz and 10 Hz.

In an embodiment, the process 770 may then continue with operation 774, which comprises recording the Zm value with the VI sensor (or probe). In an embodiment, the process 770 may then continue with operation 775, which comprises starting with an initial L3 estimate. The L3 estimate (in conjunction with the Zm value) is then used to calculate the variations of the value of G1. When the estimation of L3 is correct, the variations of the value of G1 will be minimized. That is, a series of L3 estimates may be used in order to detect a G1 minimum as indicated by the loop from operations 776 and 777. For example, the estimated value of L3 may start at 0 and progress up from 0. In other embodiments, the first estimated value of L3 may be a previously known value of L3 or an expected value of L3. When the variation of the G1 signal is minimized the process continues to the Yes branch of operation 776, and the estimation of L3 is correct at operation 778.

Referring now to FIG. 7C, a process flow diagram depicting a process 790 for determining the values of L1 and L2 is shown, in accordance with an embodiment. In an embodiment, process 790 starts at 791 and continues with a first iteration (i=1) at box 792. In the first iteration, the process begins with operation 793 which includes setting an angular frequency ω to an ω1 value from a list of angular frequencies. Once the angular frequency is set, the match system is brought to a tuned position. In an embodiment, once the match system is tuned, the process continues with operation 794 which includes recording match system parameters. For example, the match system parameters may include values such as, ωi, Zin, R0, X0, C1, and C2. The match system parameters may be known values. For example R0 and X0 may be pre-selected values or measured by an additional sensor. C1 and C2 are the variable capacitances that result in the tuned state. The value of Zin may be calculated from the measurement of Zm and the previously determined L3 value.

The process proceeds to decision block 795 which determines if the end of the angular frequency list has been reached. If the answer is no, then another iteration is performed with i updated to i=i+1 as indicated by block 796. The next ωi+1 will then be used and the match system will be re-tuned. By repeating the process a system of equations may be developed in order to computationally solve for L1 and L2.

At the end of the angular frequency list, the decision block 795 continues to operation 797. In an embodiment, operation 797 includes comparing a real part of the admittances and solving for L2. In some embodiments, a least mean squared (LMS) process may be used in order to solve for L2, though other solving techniques may also be used.

The process may then continue with operation 798, which comprises comparing the imaginary part of the admittances and solving for L1. In an embodiment, the previously solved value for L2 may be used in conjunction with a solver process (e.g., LMS) in order to come up with the value of L1, though other solving techniques may also be used. The process 790 may then end at block 799.

Accordingly, a process for determining circuit parameters (e.g., L1, L2, and L3) inside an RF match system can be implemented in a non-invasive manner.

Figure 8:
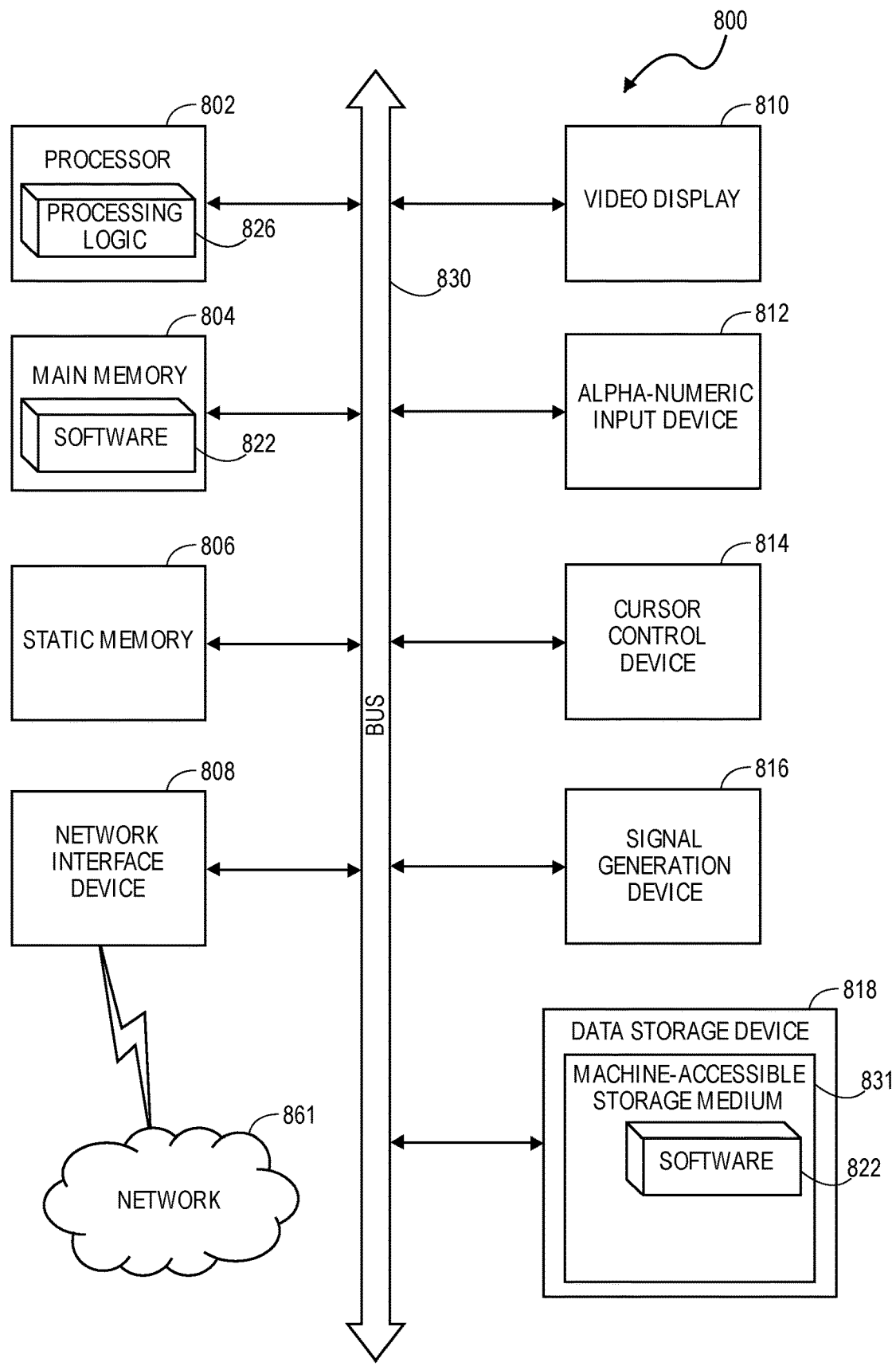
FIG. 8 illustrates a block diagram of an exemplary computer system that may be used in conjunction with a processing tool, in accordance with an embodiment

Referring now to FIG. 8, a block diagram of an exemplary computer system 800 of a processing tool is illustrated in accordance with an embodiment. In an embodiment, computer system 800 is coupled to and controls processing in the processing tool. Computer system 800 may be connected (e.g., networked) to other machines in a Local Area Network (LAN), an intranet, an extranet, or the Internet. Computer system 800 may operate in the capacity of a server or a client machine in a client-server network environment, or as a peer machine in a peer-to-peer (or distributed) network environment. Computer system 800 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 800, the term "machine" shall also be taken to include any collection of machines (e.g., computers) that individually or jointly execute a set (or multiple sets) of instructions to perform any one or more of the methodologies described herein.

Computer system 800 may include a computer program product, or software 822, having a non-transitory machine-readable medium having stored thereon instructions, which may be used to program computer system 800 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 800 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 800 may further include a system network interface device 808 for communicating with other devices or machines. The computer system 800 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 832 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 800, the main memory 804 and the system processor 802 also constituting machine-readable storage media. The software 822 may further be transmitted or received over a network 820 via the system network interface device 808. In an embodiment, the network interface device 808 may operate using RF coupling, optical coupling, acoustic coupling, or inductive coupling.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A process power controller for a plasma processing tool, comprising:
    a process power source optimizer;
    a source predictor;
    a process uniformity controller, wherein the source predictor is communicatively coupled to the process power source optimizer and the process uniformity controller; and
    a bias power controller comprising a process power bias optimizer, a bias predictor, and a process bias controller.

2. The process power controller of claim 1, wherein the source predictor estimates a continuous influence to minimize transitory response.

3. The process power controller of claim 1, wherein the source predictor estimates a system response and behavior for optimized control performance.

4. The process power controller of claim 3, wherein a feed forward and a feedback signal are used by the source predictor.

5. The process power controller of claim 1, wherein the process power source optimizer is communicatively coupled to a process power optimizer actuator.

6. The process power controller of claim 5, wherein the process power optimizer actuator comprises variable reactance actuators.

7. The process power controller of claim 6, wherein the variable reactance actuators are variable capacitors.

8. The process power controller of claim 1, wherein the source predictor receives a feed forward signal from the process power bias optimizer.

9. A method of controlling a plasma system, comprising:
    making a first parameter change in a first control loop;
    feeding forward the first parameter change to a second control loop; and
    making a second parameter change in the second control loop to anticipate a change to the plasma system generated by the first parameter change, wherein the first parameter change is a change to a first variable reactance actuator, and wherein the second parameter change is a change to a second variable reactance actuator.

10. The method of claim 9, wherein the first parameter change is a change to a plasma density within the plasma system.

11. The method of claim 10, wherein the plasma density change is a change to a central plasma density and an edge plasma density.

12. The method of claim 10, wherein the second parameter changes an impedance in an impedance matching network of the plasma system.

13. A method of controlling a plasma system, comprising:
    changing a first variable reactance actuator;
    feeding forward the change of the first variable reactance actuator to a match controller; and
    using the match controller to change actuation setting of one or both of a second variable reactance actuator and a third variable reactance actuator in response to the change of the first variable reactance actuator.

14. The method of claim 13, wherein changing the first variable reactance actuator is a change to a plasma density within the plasma system.

15. The method of claim 14, wherein the plasma density change is a change to a central plasma density and an edge plasma density.

16. The method of claim 13, wherein the first variable reactance actuator is part of a first control loop, and wherein the second variable reactance actuator and the third variable reactance actuator are part of a second control loop.

17. The method of claim 13, wherein changes to the second variable reactance actuator and the third variable reactance actuator changes an impedance in an impedance matching network of the plasma system.

* * * * *